United States Patent
Ebihara

[19]

[11] Patent Number: 6,154,069
[45] Date of Patent: Nov. 28, 2000

[54] CIRCUIT FOR DRIVING CAPACITIVE LOAD

[75] Inventor: Heihachiro Ebihara, Tokorozawa, Japan

[73] Assignee: Citizen Watch Co., Ltd., Tokyo, Japan

[21] Appl. No.: 08/978,818

[22] Filed: Nov. 26, 1997

Related U.S. Application Data

[63] Continuation of application No. 08/435,421, May 10, 1995, abandoned, which is a continuation of application No. 08/375,229, Jan. 19, 1995, abandoned, which is a continuation of application No. 07/971,836, Feb. 19, 1993, abandoned.

[30] Foreign Application Priority Data

| Jun. 21, 1991 | [JP] | Japan | 3-177449 |
| Aug. 15, 1991 | [JP] | Japan | 3-228471 |
| Jun. 22, 1992 | [JP] | Japan | PCT/JP92/007999 |

[51] Int. Cl.$^7$ ............................... H03B 1/00
[52] U.S. Cl. ..................... 327/112; 327/111; 327/484; 327/486
[58] Field of Search ................. 327/313, 314, 327/317, 321, 374, 378, 371, 382, 482, 484, 486, 488, 551, 333, 437, 111, 112

[56] References Cited

U.S. PATENT DOCUMENTS

| 2,864,007 | 12/1958 | Clapper | 327/484 |
| 3,160,766 | 12/1964 | Reymond | 327/484 |
| 3,175,100 | 3/1965 | La Mothe | 327/484 |
| 3,244,910 | 4/1966 | Leifer | 327/486 |
| 3,515,906 | 6/1970 | Geller | 327/484 |
| 3,562,557 | 2/1971 | Gates | 307/255 |
| 3,566,145 | 2/1971 | Goodale | 307/255 |
| 3,683,208 | 8/1972 | Burens | 327/482 |
| 3,748,497 | 7/1973 | Woods | 307/255 |
| 4,038,607 | 7/1977 | Schade, Jr. | 330/13 |
| 4,042,842 | 8/1977 | Hegendörfer | 307/255 |

(List continued on next page.)

FOREIGN PATENT DOCUMENTS

| 2233612 | 1/1974 | Germany | 307/255 |
| 0152 249 | 11/1981 | Germany | 327/483 |
| 44-13408 | 6/1969 | Japan . | |
| 45-527 | 1/1970 | Japan . | |
| 53-5468 | 2/1978 | Japan . | |
| 53-17027 | 6/1978 | Japan . | |
| 54-2051 | 1/1979 | Japan . | |
| 58-29647 | 6/1983 | Japan . | |
| 59-57017 | 4/1984 | Japan . | |
| 61-42118 | 3/1986 | Japan . | |
| 61-158720 | 10/1986 | Japan . | |
| 0990286 | 4/1965 | United Kingdom | 307/255 |

OTHER PUBLICATIONS

"The Linear Integrated Circuit Data Book, 1976 (Fairchild Semiconductor Co.)", pp. 12–93 & 12–134.

*Primary Examiner*—Terry D. Cunningham
*Attorney, Agent, or Firm*—Finnegan, Henderson, Farabow, Garrett & Dunner, L.L.P.

[57] ABSTRACT

A circuit for driving a capacitive load using a booster having a low power consumption, which amplifies spike-like signals at high speeds and produces a large voltage and a large current, and wherein two transistors 104 and 111 are connected in series across a first power source H1 and a second power source L1 having a potential lower than that of the first power source. An output terminal OUT is provided at a portion where the two transistors are connected together, and the first transistor 104 connected between the first power source and the output terminal has a complementary relationship to the second transistor 11 connected between the output terminal and the second power source. The firstransistor 104 is constituted by a PNP-type bipolar transistor or a P-type field-effect transistor, the second transistor 111 is constituted by an NPN-type transistor or an N-type field-effect transistor, and between an input terminal IN and a control terminal of each of the transistors are connected in parallel a capacitor and a means that applies a bias to the control terminal.

4 Claims, 18 Drawing Sheets t

U.S. PATENT DOCUMENTS

| | | | |
|---|---|---|---|
| 4,103,245 | 7/1978 | Yokoyama | 330/265 |
| 4,253,035 | 2/1981 | Amitay | 307/255 |
| 4,412,141 | 10/1983 | Jacobsen | 307/255 |
| 4,419,593 | 12/1983 | Butler et al. | 307/255 |
| 4,486,672 | 12/1984 | Nishimura et al. | 307/262 |
| 4,617,482 | 10/1986 | Matsuda | 327/437 |
| 4,642,482 | 2/1987 | Kasperkovitz et al. | 307/494 |
| 4,837,457 | 6/1989 | Bergstrom et al. | 327/482 |
| 4,922,139 | 5/1990 | Giebel | 307/246 |
| 4,937,470 | 6/1990 | Zeiler | 327/482 |
| 4,987,381 | 1/1991 | Butler | 330/255 |
| 5,144,157 | 9/1992 | Russell et al. | 307/270 |
| 5,583,528 | 12/1996 | Ebihara | 345/58 |

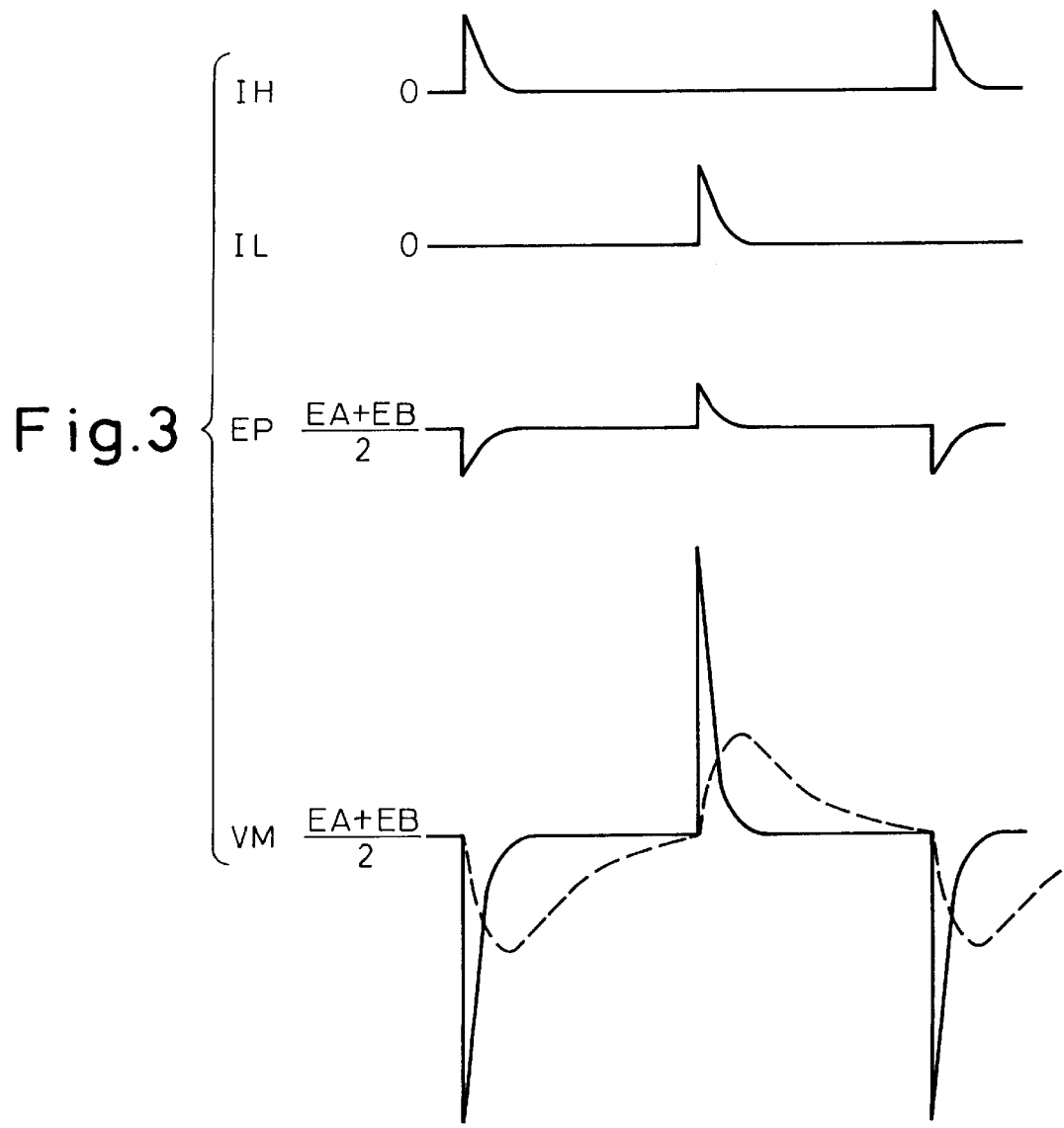

Fig.8(a)
PRIOR ART
Fig.8(b)
PRIOR ART
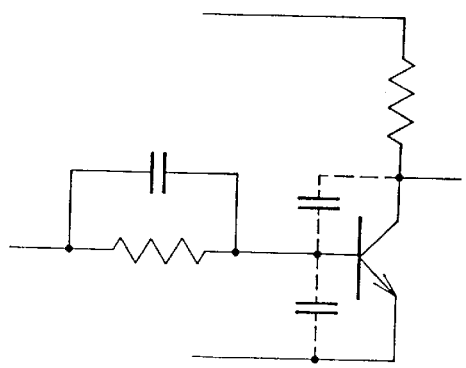
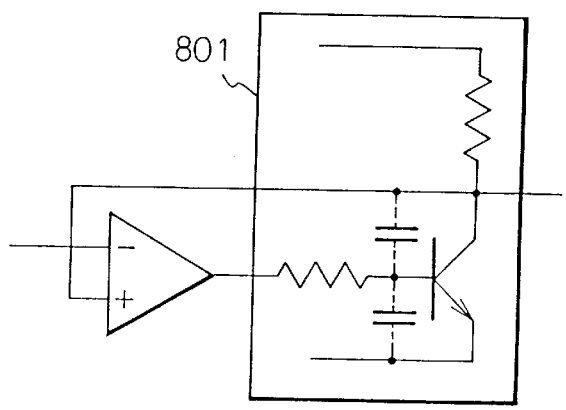

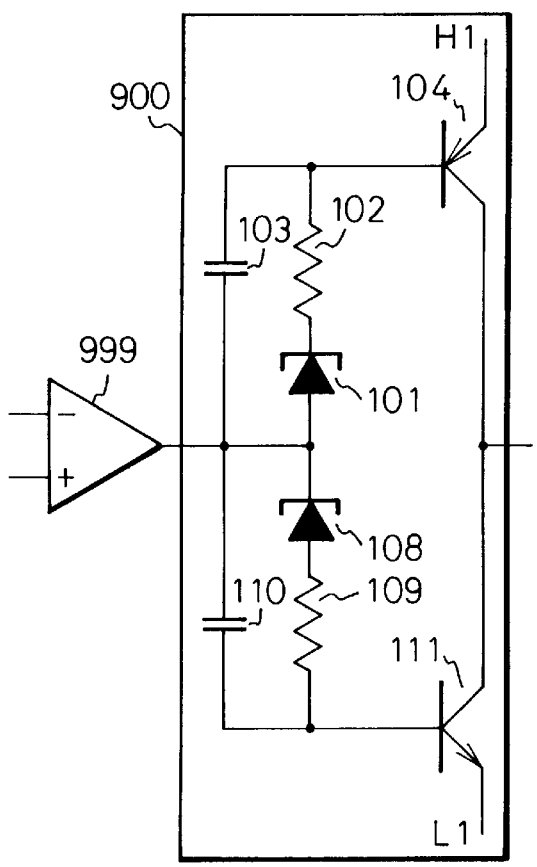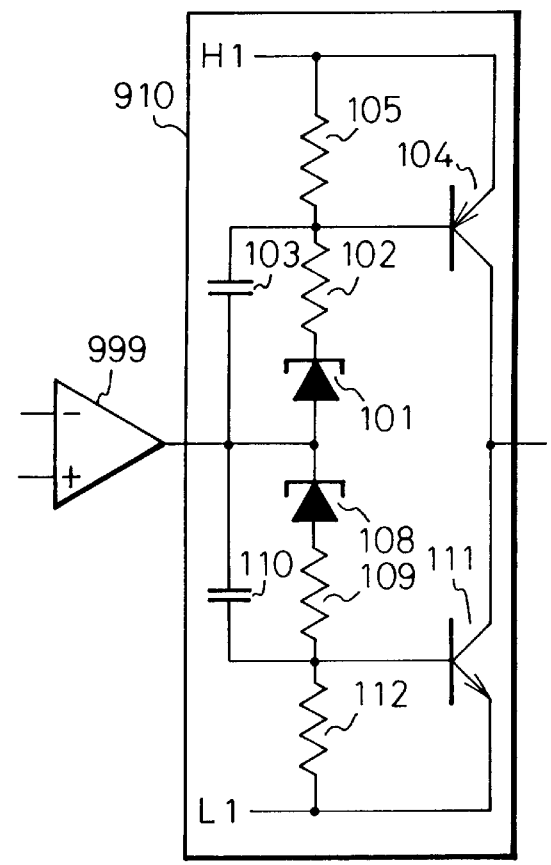

CIRCUIT FOR DRIVING CAPACITIVE LOAD

This is a continuation of application Ser. No. 08/435,421 filed May 10, 1995, now abandoned, which is a continuation of Ser. No. 08/375,229 filed Jan. 19, 1995, now abandoned, which is a continuation of Ser. No. 07/971,836 filed Feb. 19, 1993, now abandoned.

TECHNICAL FIELD

The present invention relates to a low-power-consumption power source circuit for driving at high speeds a liquid crystal display.

Background Art

A differential amplifier is very useful since it is capable of functionally processing input voltages applied to the two input terminals, but its ability is still not sufficient in the case where a large spike-like electric current is to be output at high speeds. That is, the differential amplifiers that feature a high-speed operation are usually capable of outputting small electric currents only and, on the other hand, the differential amplifiers that feature a large output current usually operate at low speeds. Even those differential amplifiers that feature both a high-speed operation and a large output current have been designed to work within a range of small signals only and their speed drops suddenly when they are made to operate while maintaining large amplitudes or to produce large currents. The present inventors were urged to use a differential amplifier which works at high speeds in response to spike-like signals, and produces a large output voltage and a large output current yet consuming a reduced amount of electric power, and therefore investigated the products that have been placed in the market, but could not find any amplifier that is perfectly satisfactory in performance.

Before describing the prior art, mentioned below are the functions and characteristics of a differential amplifier or a booster that has heretofore been demanded and desired by people with ordinary skill in the art. FIG. 2 illustrates a power source circuit for driving a liquid crystal display device that is proposed in Japanese Patent Application No. 2-184147. As is well known, a liquid crystal works as a capacitive load into which a spike-like current flows when a driving condition has changed. A drop in the voltage that develops when a current flows into the liquid crystal through a resistance that exists on the power source lines, causes a voltage applied across both terminals of a liquid crystal pixel to be deformed from an ideal rectangular waveform, resulting in a decrease in the contrast or the occurrence of crosstalk. The embodiment of FIG. 2 improves this phenomenon and gives very excellent effects.

In FIG. 2, symbols VH and VL denote potentials that are applied to column electrodes of a liquid crystal panel via a column electrode drive circuit, and VM denotes a potential applied to row electrodes of the liquid crystals via a row electrode drive circuit. Symbols rs and rc denote parasitic resistances on the power source lines. A fixed potential of (EA+EB)/2 has heretofore been given as VM. In the case of FIG. 2, however, on the potential VM is superposed a voltage that corresponds to a current IH or IL which flows into the liquid crystal via the segment drive circuit or flows out therefrom in order to compensate for a drop in the voltage caused when a current flows through a parasitic resistance, to bring the waveform of a drive voltage applied across both terminals of the liquid crystal closer to an ideal condition and to prevent performance from being deteriorated.

FIG. 3 is a diagram of operation waveforms of the circuit of FIG. 2. When the currents IH and IL of FIG. 2 flow in the form of spikes into the liquid crystal which is a capacitive load, a potential at the positive input terminal of the differential amplifier 200 changes in response to the currents IH and IL, and the output VM of the differential amplifier 200 becomes $$(EA+EB)/2 - (\tfrac{1}{2}+R/r) \cdot Ra \cdot (IH-IL).$$

The output VM decreases when the current IH flows and increases when the current IL flows thereby to compensate for a distortion in the liquid crystal drive voltage caused by a voltage drop through parasitic resistances rs, rc. The diagram of an ideal operation waveform is indicated by a solid line.

The object was accomplished not by fixing the VM value but by changing the VM value depending on the current that flows into the liquid crystal. In order for the circuit of FIG. 2 to exhibit its effects to a sufficient degree, however, high performance is expected of the differential amplifier 200 shown in FIG. 2. When neither IH or IL flows, the output VM should simply be maintained at (EA+EB)/2 and no output current is required. When IH and IL flow, however, a relatively large output voltage and a relatively large output current must be produced. Moreover, since a series of operations involves a positive feedback via the load, the operation speed becomes very high and, hence, the differential amplifier 200 must be capable of operating while maintaining large amplitudes and of producing large currents yet maintaining a high speed. Performance required for the differential amplifier may vary depending upon the size of the liquid crystal panel or the driving conditions. For instance, a maximum value of the output voltage is ±10V, a maximum output current is several hundred milliamperes, and a response speed is 100 nS or less. Moreover, the liquid crystal display devices are in many cases mounted on the devices that are powered on small cells, and their current consumption must be very small except for the load current.

Performance required for the differential amplifier shown in FIG. 2 can be summarized as follows:

(A) A large voltage amplification factor.

(B) A large voltage output.

(C) A large current amplification factor.

(D) A large current output.

(E) A high-speed operation.

(F) A small current consumption.

(G) A DC feedback is possible.

There are products available that partially satisfy the above-mentioned performance but there is no product available that satisfies all of the above requirements simultaneously. Or, those products that seem to exhibit performance relatively close to the above requirements, though some of them are not quite satisfied, are very expensive, and a limitation is imposed on their use as a component of a display device.

When a sufficient degree of performance is not obtained from the differential amplifier alone, a booster is usually used based on an idea that characteristics which are not possessed by the differential amplifier are supplemented by an external circuit while fully utilizing the functions of the differential amplifier. There are a lot of prior arts related to a booster, and representative conventional examples are shown in FIGS. 4(a), 4(b), and 5. FIGS. 4(a) and 4(b) illustrate the most well-known non-inversion boosters of the current amplification type, which, however, are quite different from the boosters that are earnestly desired by people having a participation with a technical field of the liquid crystal.

That is, with these boosters of the structure in which the output is taken out from the emitter side of the transistor, there is obtained no voltage amplification factor. In order to obtain a large voltage output, therefore, the differential amplifier of the input side must operate by maintaining a large amplification. When the differential amplifier is operated with a large amplification, however, the response speed drops drastically as mentioned earlier and the waveform becomes as indicated by a broken line in FIG. 3, which is not quite utilizable. That is, in order to maintain the response speed, the differential amplifier must be operated with a very small output level. Therefore, the booster must have a sufficiently large voltage amplification factor. In other words, the object is not accomplished with the current amplification type booster of FIG. 4.

FIG. 5 illustrates a fundamental booster of the inversion type described in "The Linear Data Book, 1976 (National Semiconductor Co.)" or "The Linear Integrated Circuit Data Book, 1976 (Fairchild Semiconductor Co.)", which creates a voltage amplification factor. In this booster however, a voltage drop caused by a current that flows through a resistor inserted in the power source line is used as an input signal source for the booster. This current is the sum of a current that flows into the differential amplifier (which is not necessarily linear with respect to the input signal) and a current (which can be regarded to be linear with respect to the input signal) that flows into the load resistance. In order for this current to be almost linear with respect to the input signal, therefore, the load resistance must be very small and the current flowing into the load resistor must be very great. Otherwise, correct simplification is not carried out. This, however, results in an increase in the consumption of electric power by the circuit. Moreover, as in the case of an increase in the output voltage, an increase in the output current of the differential amplifier results in a decrease in the response speed of the differential amplifier.

It can be considered that the constitution shown in FIG. 6(a) produces an output of a sufficiently large voltage amplitude in response to even a slight change in the output signal of the differential amplifier 999 provided the resistors 602 and 609 have relatively small values. However, the aforementioned condition (F) is not satisfied because of a large through current under the condition where both the PNP transistor T1 and the NPN transistor T2 are turned on with the output being near zero level. In order to satisfy the condition (F), the resistors 602 and 609 must have sufficiently large values. With a large spike-like current being fed to the load under such conditions, however, the amplitude of output of the differential amplifier 999 must be increased in order to supply large base currents to the PNP transistor T1 and NPN transistor T2. As a result, the response characteristics of the differential amplifier 999 are sacrificed and the above condition (E) is not satisfied.

The circuit of FIG. 6(b) can then be considered. That is, a resistor 605 is newly inserted between the base and the emitter of the PNP transistor T1, and a resistor 612 is newly inserted between the base and the emitter of the NPN transistor T2. With this constitution, the base bias potential of the transistors T1 and T2 is more stabilized compared with that of FIG. 6(a), and the static current consumption can be decreased despite the small values of the resistors 602 and 609. However, the output voltage of the differential amplifier 999 is applied to the transistors T1 and T2 after being divided by the resistors 602, 609 and by the resistors 605, 612. In order to obtain the same load current, therefore, the output voltage of the differential amplifier 999 must be increased by dividing the voltage, and the speed of the differential amplifier 999 is sacrificed correspondingly.

The objects of the present invention therefore are to improve the aforementioned defects inherent in the prior art; i.e., (1) to provide a booster for a differential amplifier which amplifies the voltage and current of spike-like signals or a booster for a circuit for driving a capacitive load which is used together with a differential amplifier and, as a whole, satisfies the aforementioned conditions (A) to (G);

(2) to provide a differential amplifier which amplifies the voltage and current of spike-like signals or an inexpensive and novel circuit for driving a capacitive load satisfying the aforementioned conditions (A) to (G); and (3) to provide a circuit for driving a capacitive load which has a function of flowing a heavy current instantaneously and of simply outputting a predetermined voltage at other times.

DISCLOSURE OF THE INVENTION

In order to solve the aforementioned problems, the circuit for driving a capacitive load according to the present invention has basically the following technological constitution.

That is, the present invention is concerned with a circuit for driving a capacitive load in which two transistors are connected in series across a first power source and a second power source having a potential lower than that of the first power source, an output terminal is provided at a portion where the two transistors are connected together, the first transistor connected between the first power source and the output terminal has a complementary relationship to the second transistor connected between the output terminal and the second power source. The first transistor is constituted by a PNP-type bipolar transistor or a P-type field-effect transistor, the second transistor is constituted by an NPN-type transistor or an N-type field-effect transistor, and between an input terminal and a control terminal of each of the transistors are connected in parallel a capacitor and a means that applies a bias to the control terminal.

In the above-mentioned constitution, the transistors may be either bipolar transistors or field-effect transistors (FETs).

When bipolar transistors are used, the circuit according to the present invention is concretely constituted as described below.

That is, the output of the differential amplifier is applied to the base terminal of the PNP transistor via a parallel circuit of a resistor and a capacitor, the emitter terminal of the PNP transistor is connected to the first power source line, the collector of the PNP transistor is connected to the collector terminal of the NPN transistor to form an output terminal, the emitter terminal of the NPN transistor is connected to the second power source line, and the base terminal thereof is supplied with the output of the differential amplifier via a parallel circuit of a resistor and a capacitor.

When the field-effect transistors (FETs) are used, the circuit according to the present invention is concretely constituted as described below.

That is, the first transistor is constituted by a P-type field-effect transistor, the second transistor is constituted by an N-type field-effect transistor, the source terminal of the first transistor is connected to the first power source, the source terminal of the second transistor is connected to the second power source, and a common output terminal is constituted at a node where the two transistors are connected together.

According to the present invention, the static biases of the PNP transistor and the NPN transistor are determined by the resistors connected to the base terminals thereof, and very small currents flow through the two transistors. Moreover, the dynamic signal is directly supplied to the base terminals of the transistors via capacitors connected to the base terminals thereof without being divided. The transistors are emitter-grounded and have sufficiently large voltage amplification factors. Therefore, the differential amplifier needs to produce an output of a small amplitude and does not lose its high-speed response characteristics. Due to the current amplification action of the transistors, furthermore, it is allowed to give a large amplitude and a large current to the load instantaneously. Moreover, since static biasing means for the PNP transistor and NPN transistor are connected to the input terminal in a DC manner, it becomes possible to provide a DC feedback circuit at the input terminal of the differential amplifier.

BRIEF DESCRIPTION OF DRAWINGS

FIG. 3 is a diagram showing ideal operation waveforms and undesirable operation waveforms of the circuit of FIG. 2;

FIGS. 8(a) and 8(b) are circuit diagrams for explaining a difference between the present invention and a prior art the constitution of which resembles that of the present invention;

FIGS. 9(a) and 9(b) are circuit diagrams illustrating third and fourth embodiments of the present invention;

BEST MODE FOR CARRYING OUT THE INVENTION

Embodiments of the circuit for driving a capacitive load according to the present invention will now be described with reference to the drawings.

In the following description, the transistors used are bipolar ones. However, it need not be pointed out that the same effects can be obtained even with field-effect transistors.

Figure 6A:
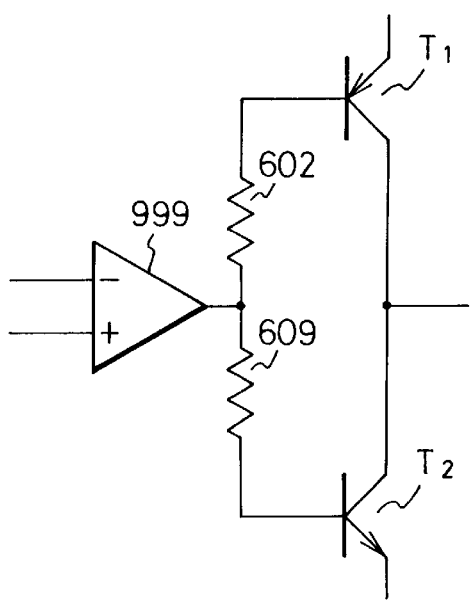
FIGS. 6(a) and 6(b) are circuit diagrams for explaining problems of the boosters of the collector output type.
Figure 7A:
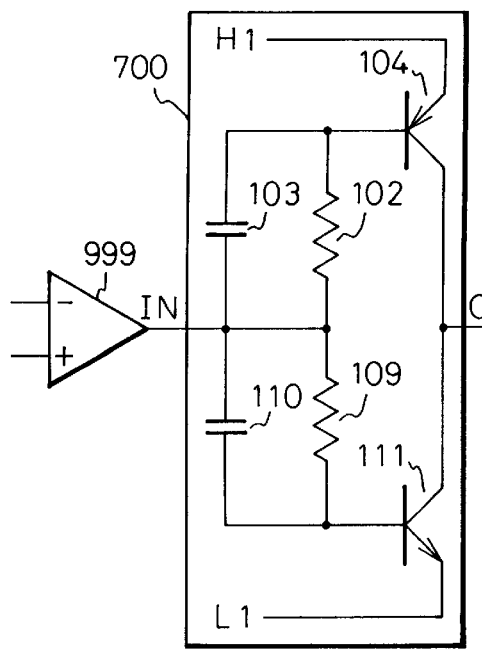
FIGS. 7(a) and 7(b) are circuit diagrams illustrating first and second embodiments of the present invention.

FIG. 7(a) illustrates a first embodiment of the present invention based on FIG. 6(a), in which the output of a differential amplifier 999 which is separate from the present invention is fed to a booster 700 of the present invention. The booster 700 is constituted as described below. The input terminal IN is connected to the base terminal of a PNP transistor 104 which is the first transistor via a resistor 102 which is one of the biasing means and a capacitor 103 which is in parallel therewith, and is further connected to the base terminal of an NPN transistor 111 which is the second transistor via a resistor 109 and a capacitor 110 which is in parallel therewith. The emitter terminal of the PNP transistor 104 is connected to a first power source line H1 which is the first power source, and the emitter terminal of the NPN transistor 111 is connected to a second power source line L1 which is the second power source. The collector of the NPN transistor 111 and the collector of the PNP transistor 104 are connected in common to form an output terminal OUT.

In FIG. 7(a), the resistors 102 and 109 have sufficiently large values in order to suppress the static current consumption by the booster 700. The dynamic signal is applied to the bases of the transistors 104 and 111 via the capacitors 103 and 110. Unlike in the booster 700 of the present invention, therefore, the transistors 104 and 111 become sufficiently active even when the amplitude of the output of the differential amplifier 999 connected to the input terminal IN is small. Therefore, the differential amplifier 999 does not lose its high-speed performance.

Figure 6B:
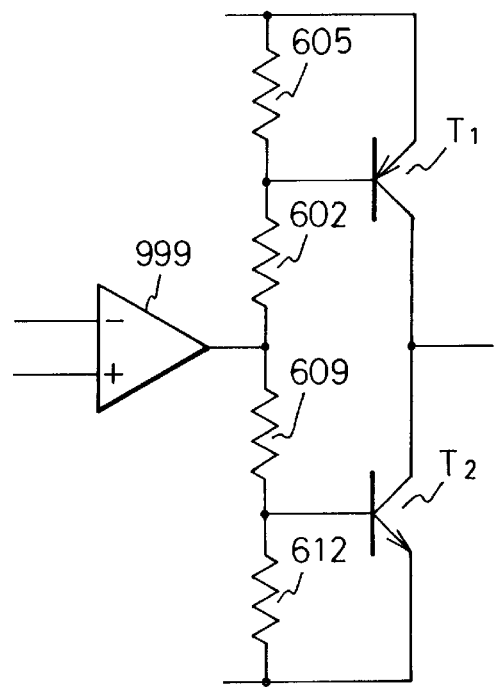
Figure 7B:
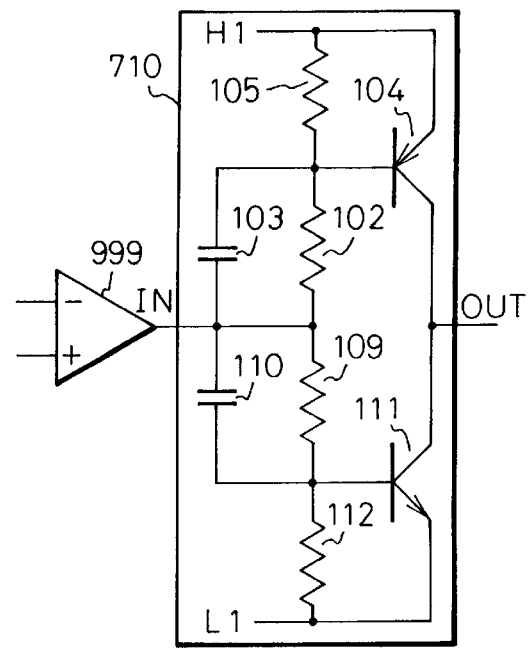

FIG. 7(b) illustrates a second embodiment of the present invention. In order to stabilize the base biases of the first transistor 104 and the second transistor 111, resistors 105 and 112 are inserted between the base of the first transistor 104 and the first power source line H1 and between the base of the second transistor 111 and the second power source line L1. With the constitution of FIG. 7(b) as described with reference to FIG. 6(b), the signal applied to the base of the transistors 104 and 111 is divided via the resistors 102 and 109. However, since the dynamic signals are transmitted through the capacitors 103 and 110, it can be considered that only the static signals are divided. In the case of the present invention, output current is almost not required under the static condition. Even when the static signal is divided, therefore, the output signal of the differential amplifier 999 does not greatly change thus maintaining the static condition, and the differential amplifier does not lose its performance.

In the first and second embodiments of the present invention, the feature resides in that the output terminal of the differential amplifier 999 is connected to the bases of the transistors via a parallel circuit of a resistor and a capacitor. Because of simplicity in the constitution, however, the circuit of the present invention may be confused with a circuit constitution that has heretofore been proposed as shown in FIG. 8(a). The constitution of FIG. 8(a) is used chiefly for a pulse amplifier circuit. A resistor inserted in the base of the transistor is a base current-limiting resistor which prevents the response speed from being decreased by the base charge accumulation effect specific to the bipolar transistor. Basically, a signal having a sufficiently large amplitude is applied via this resistor. In this case, the signal waveform at the base terminal is distorted due to this current-limiting resistor and a parasitic capacity at the base terminal of the transistor, and the output waveform is distorted. The distortion, however, is corrected by a capacitor which is generally called a speed-up capacitor that is inserted in parallel with the current-limiting resistor. The role of this capacitor is to make the rising time and the breaking time of the pulse waveform steep. That is, the current-limiting resistor basically transmits dynamic signals but does not bias the transistor, and the capacitor has a function for compensating for distortion of the dynamic signal waveforms transmitted through the current-limiting resistor. In the case of the present invention, on the other hand, the resistors 102 and 109 shown in FIG. 7(a) are for biasing the transistors 104 and 111 but do not transmit dynamic signals. The dynamic signals are transmitted through the capacitors 103 and 110. Therefore, though the circuit of FIG. 7(a) may resemble in constitution the circuit of the present invention, their functions and technical ideas are altogether different.

In general, furthermore, the circuit constitution of FIG. 7(a) need not be used for a conventional differential amplifier circuit that has a feedback circuit. That is, the buffer circuit of FIG. 8(b) is constituted in such a manner that the output of the differential amplifier is applied to an inversion amplifier 801, the output of the inversion amplifier 801 is fed back to the positive input terminal of the differential amplifier, and a signal is applied to the negative input terminal of the differential amplifier. In this constitution, if the waveform is distorted in the inversion amplifier 801 and if the output waveform of the inversion amplifier 801 becomes different from the signal waveform that is applied to the negative input terminal of the differential amplifier, then the differential amplifier changes its own output waveform so as to eliminate the difference in the waveforms. Therefore, the differential amplifier circuit that has a feedback circuit does not necessarily need the speed-up capacitor shown in the constitution of FIG. 8(a). Thus, the differential amplifier circuit of the present invention is a novel one having a bias means connected to the input terminal of the booster and a coupling capacitor connected to the input terminal.

FIGS. 9(a) and 8(b) illustrate third and fourth embodiments of the present invention. In FIGS. 9(a) and 9(b), the same reference numerals denote the same constituent elements as those of the first and second embodiments shown in FIGS. 7(a) and 7(b). In FIG. 9, diodes 101 and 108 are inserted in series with the resistors 102 and 109 shown in FIG. 7. The diodes work as described below. In FIG. 7, the dynamic signals are applied to the base terminals of the transistors 104 and 111 via the capacitors 103 and 110, and the electric charges are accumulated in the capacitors 103 and 110 as the base currents flow through the capacitors 103 and 110. The electric charges are discharged via the resistors 102 and 109. Here, however, the electric charges are not fully discharged if time constants determined by the capacitors 103, 110 and the resistors 102, 109 are longer than the period of dynamic signals, i.e., the electric charges accumulated in the capacitors 103 and 110 increase with the lapse of time, and bias potentials at the bases of the transistors 104 and 111 gradually undergo a change. The values of the capacitors 103 and 110 cannot be decreased much from the standpoint of allowing a sufficiently large base current to flow to the transistors, and the values of the resistors 102 and 109 cannot be decreased much either, from the standpoint of suppressing the static current consumption.

With the diodes 101 and 108 being inserted as shown in FIG. 9, therefore, the amount of the voltage drop across the resistors 102 and 109 can be decreased by the threshold voltage of the diodes. Therefore, the values of the resistors 102 and 109 can be decreased without increasing the static current consumption and, thus, the time constant for discharge can be decreased to solve the above-mentioned problem.

Figure 10:
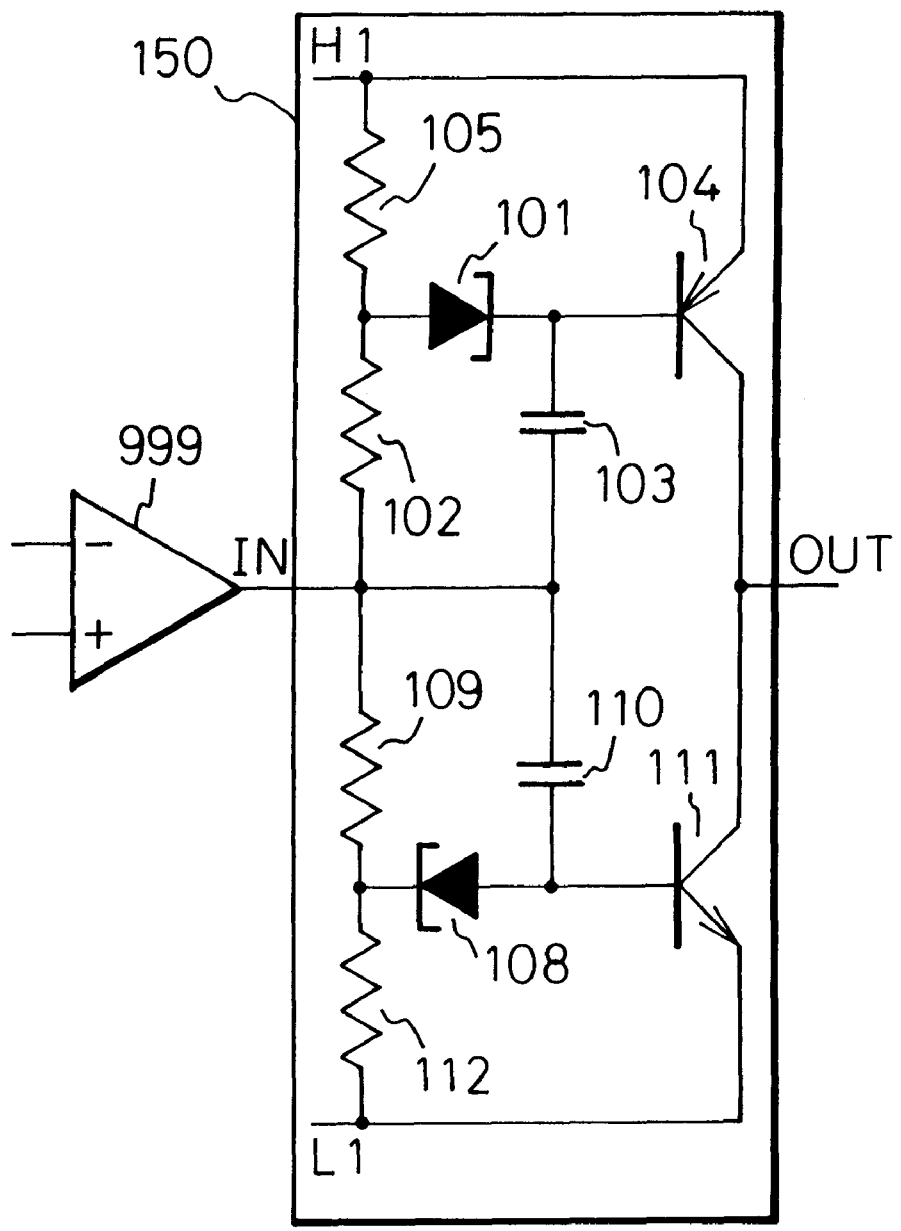
FIG. 10 is a circuit diagram illustrating a fifth embodiment of the present invention.

FIG. 10 is a circuit diagram illustrating a fifth embodiment of the present invention, wherein the input terminal IN is connected via a resistor 102 to the ends of a resistor 105 and of a diode 101, connected via a capacitor 103 to the other end of the diode 101 and to the base terminal of a PNP transistor 104 which is the first transistor, and is further connected via a resistor 109 to the ends of a resistor 112 and of a diode 108, and, via a capacitor 110, to the other end of the diode 108 and to the base terminal of an NPN transistor 111 which is the second transistor. The other end of the resistor 105 and the emitter terminal of the PNP transistor 104 are connected to the first power source line H1, and the other end of the resistor 112 and the emitter terminal of the second NPN transistor 111 are connected to the second power source line L1. The collector of the first PNP transistor 104 and the collector of the second NPN transistor 111 are connected in common to form an output terminal.

The difference between the biasing method of FIG. 10 and the biasing method of FIG. 9(b) will be described with reference to FIG. 11. The circuit of FIG. 9(b) is partly drawn in FIG. 11(a). Some prerequisites are provided to make the comparison concrete. For instance, it is presumed that the potential of the first power source line H1 is 20V, and the potential at the input terminal of the booster is 0V under static operating conditions. It is further presumed that the base current of the transistor 104 is very small under a condition where the voltage is 0.5V across the base and the emitter, and that the diode has a threshold voltage of 19V. When the potential at the base terminal of the transistor 104 is set at 19.5V under the condition of this prerequisite, the base current of the transistor 104 can be neglected. Therefore, the current Ix simply flows from the potential of 20V toward the potential of 0V via the resistor 105, diode 101 and resistor 102. At this moment, the voltage applied across both terminals of the resistor 105 is 0.5V, and the threshold voltage of the diode is 19V. Therefore, the voltage applied across both terminals of the resistor 102 becomes 0.5V. Since an equal current Ix flows through these two resistors, their resistances are also equal to each other. In this case, the signal applied to the input terminal of the booster is divided to one-half at the base end of the transistor 104.

Figure 11A:
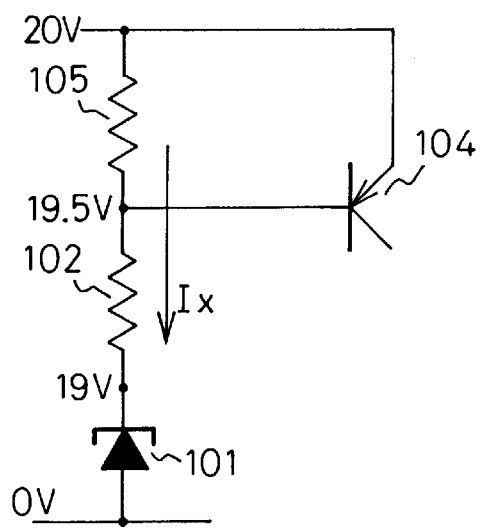
FIGS. 11(a) and 11(b) are diagrams which explain the fifth embodiment of the present invention.
Figure 11B:
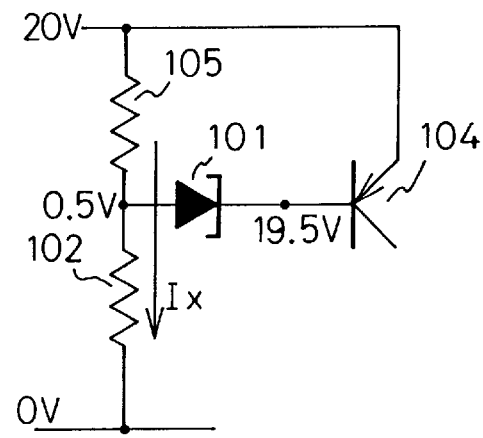

FIG. 11(b) is a diagram illustrating a portion of FIG. 10, and is considered here based on the same prerequisite as that of FIG. 11(a). When the potential at the base terminal of the transistor 104 is set at 19.5V, the current Ix flows from 20V toward 0V via the resistor 105 and the resistor 102. A voltage of 19.5V is applied across both terminals of the resistor 105 and a voltage of 0.5V is applied across both terminals of the resistor 102 while an equal current flows through these resistors. Therefore, the resistance 105 should be 39 times as great as the resistance 102. In this case, the signal applied to the input terminal of the booster is divided to 39/40 at the base terminal of the transistor 104.

Compared to the method of FIG. 9(b), the method of FIG. 10 shows an improved signal voltage dividing ratio by the resistors, which, however, is not so meaningful as far as the transmission of spike-like dynamic signals is concerned. This is because, the dynamic signals are not transmitted through the resistors 102 and 109 but are transmitted through the capacitors 103 and 110 as mentioned earlier. However, sensitivity to a fluctuation in the static potential is strikingly improved, and the stability of feedback is markedly improved.

Figure 12:
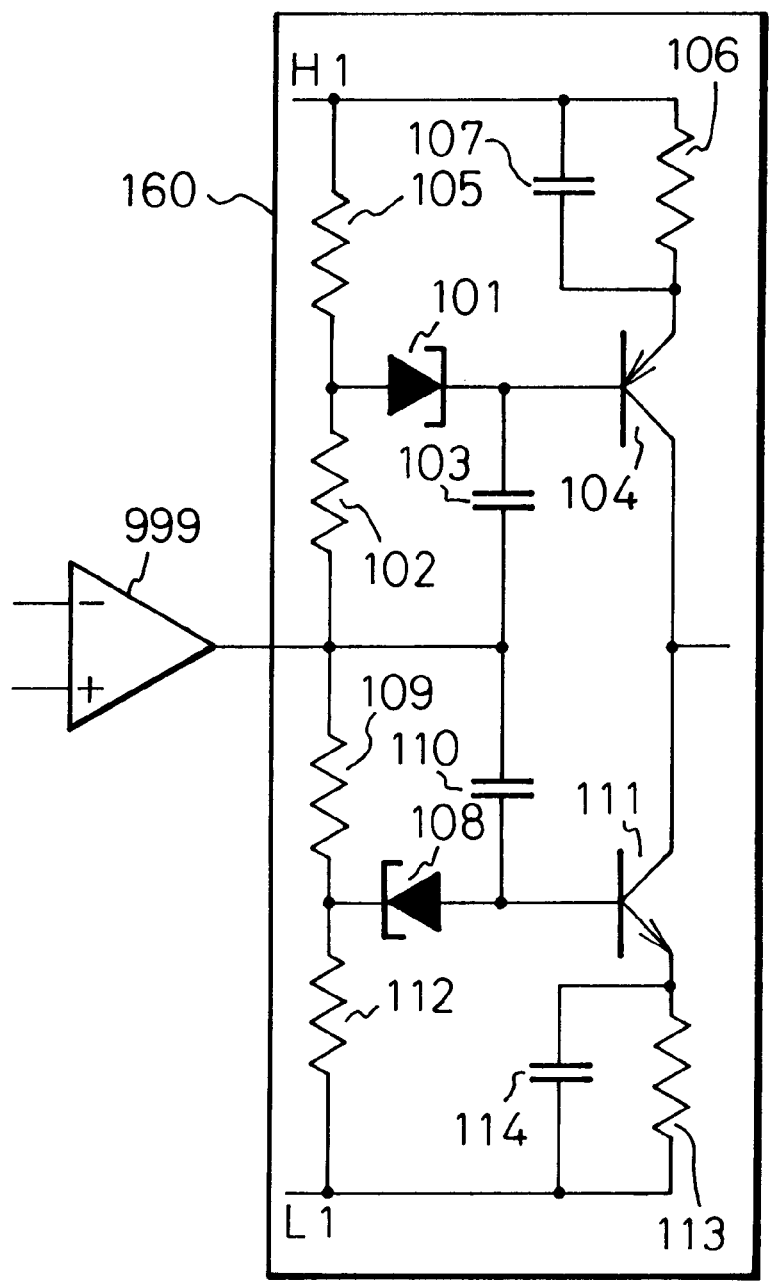
FIG. 12 is a circuit diagram illustrating a sixth embodiment of the present invention.

FIG. 12 is a circuit diagram illustrating a sixth embodiment of the present invention for stabilizing the static current consumption, which is an improvement of the fifth embodiment shown in FIG. 10 and can be adapted to the aforementioned first to fourth embodiments, as a matter of course. In FIG. 12, a parallel circuit consisting of a resistor 106 and a capacitor 107 is inserted between the emitter of the first transistor 104 and the first power source line 106, and a parallel circuit consisting of a resistor 113 and a capacitor 114 is inserted between the emitter of the second transistor 111 and the second power source line.

In the constitution of FIG. 12, the static bias condition for, for example, the first transistor 104 is stabilized against variance of the circuit constituent elements owing to the negative feedback action that stems from the drop of voltage as a current flows through the resistor 106. On the other hand, currents flow through the capacitors 107 and 114 in response to spike-like dynamic input signals, and a sufficiently large output current can be obtained. Moreover, since the resistors 102 and 109 are allowed to have smaller values, the discharge time constants of the capacitors 103 and 110 can be further decreased.

Figure 1:
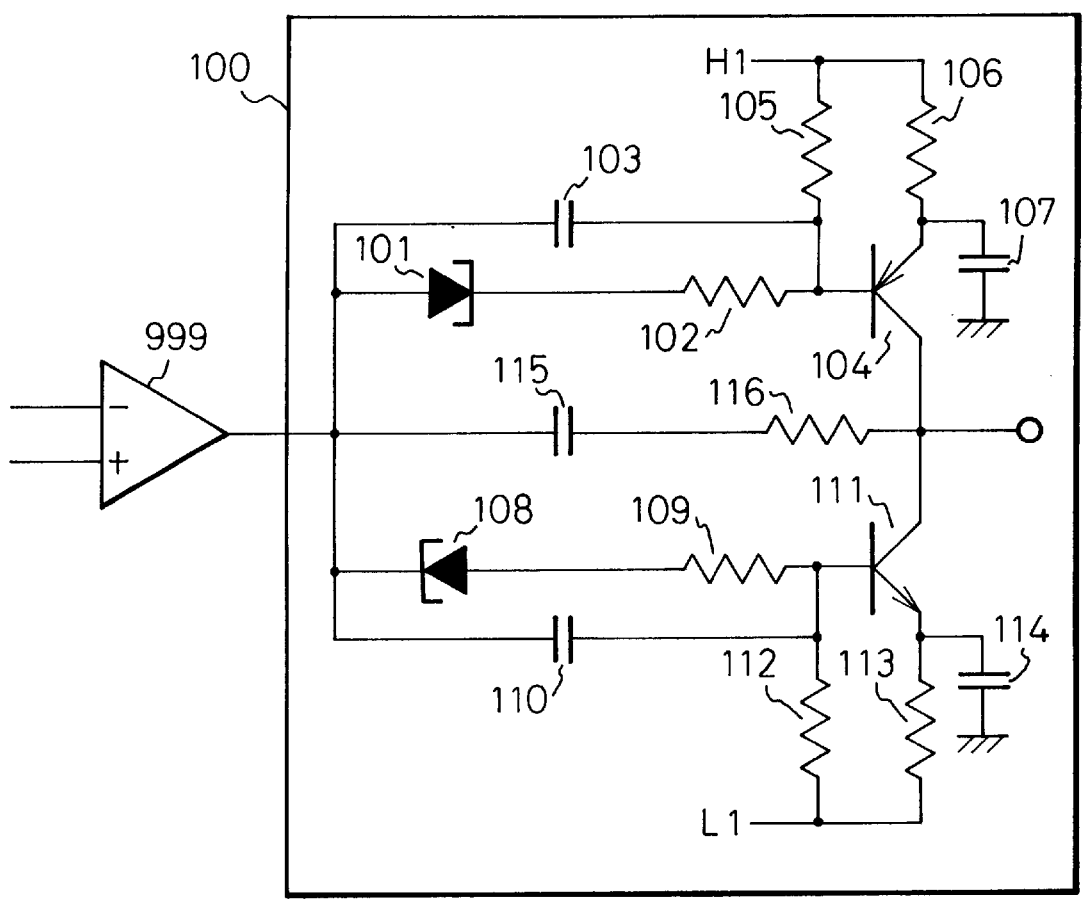
FIG. 1 is a diagram of a circuit constitution illustrating a seventh embodiment of the present invention.

In general, a liquid crystal display device necessitates a plurality of voltages some of which are obtained from a main voltage source through voltage convertors having relatively small output capacities. In the first to sixth embodiments of the present invention, when the power source lines H1 and L1 do not have sufficiently large output capacities, the potentials of the power source lines H1 and L1 undergo a change accompanying the dynamic output of the booster. When the power source lines H1 and L1 are connected to the voltage circuit for driving the liquid crystal, the voltage for driving the liquid crystal undergoes a change to affect the displayed state. FIG. 1 illustrates a seventh embodiment of the present invention which solves this point and is an improvement over the fourth embodiment of FIG. 9(b). As a matter of course, this embodiment can be adapted to any other embodiments of the present invention.

In FIG. 1, a booster 100 is constituted in the same manner as the fourth embodiment of FIG. 9(b) except capacitors 107, 114 and resistors 106, 113. That is, the emitter of the transistor 104 is connected to the first power source line H1 via the resistor 106, and is connected, via the capacitor 107, to a third power source line which is different from the first and second power source lines. The emitter of the second transistor 111 is connected to the second power source line via the resistor 113, and is connected, via the capacitor 114, to a fourth power source line which is different from the first and second power source lines. As required, furthermore, an oscillation-preventing circuit is provided in FIG. 1 being constituted by a capacitor 115 and a resistor 116. The oscillation-preventing circuit can be provided in any other embodiments of the present invention.

According to the seventh embodiment of FIG. 1, instantaneous and large currents that flow into or out of the output terminals of the booster 100 flow into or out of the power source lines which are different from the first and second power source lines via the capacitors 114 and 107. Therefore, voltages virtually do not change on the first and second power source lines H1 and L1 through the emitter potentials of the PNP transistor 104 which is the first transistor and of the NPN transistor 111 which is the second transistor undergo a change. Changes in the emitter potentials of the PNP transistor 104 which is the first transistor and of the NPN transistor 111 which is the second transistor recover as currents flow from or flow out into the first and second power source lines H1 and L1 via the resistors 106 and 113. Accordingly, large currents do not suddenly flow in from or flow out to the first and second power source lines H1 and L1, and the potentials of the first and second power source lines H1 and L1 remain stable without imposing any problem even when it is used as a voltage source for driving liquid crystals.

In the above embodiment, the third and fourth power sources may be, for example, GND and, hence, may be used in common.

Figure 13:
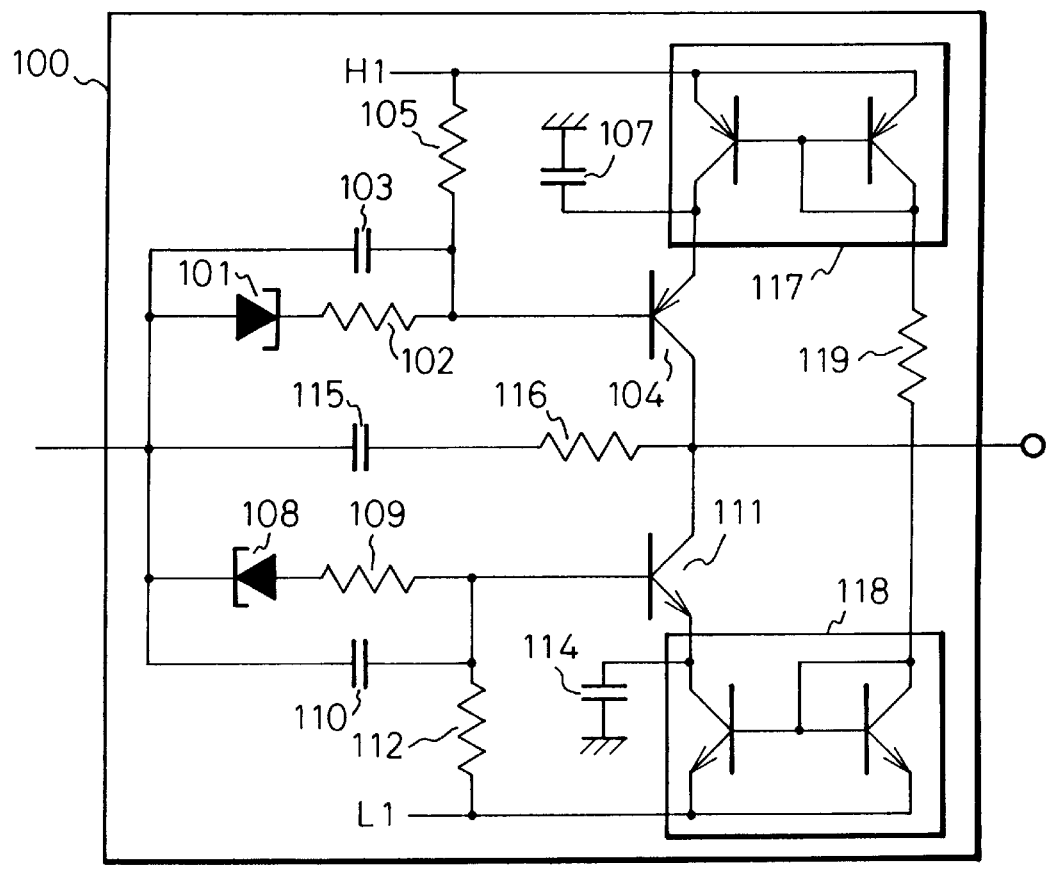
FIG. 13 is a circuit diagram illustrating an eighth embodiment of the present invention.

FIG. 13 illustrates an eighth embodiment of the present invention which is a further improvement over that of FIG. 1. In FIG. 13, the resistors 106 and 113 of FIG. 1 are replaced by constant-current sources 117 and 118. With this constitution, the static current consumption is clearly restricted by the constant-current sources. In addition, constant charging currents flow into the capacitors 107 and 114 at the time when they are recovering from the discharged condition, enabling the time of recovery to be shortened and the operation to be stabilized. The improvement of FIG. 13 can be adapted to any other embodiments of the present invention. Here, however, the operation is stabilized when the resistors 105 and 112 are provided.

Figure 2:
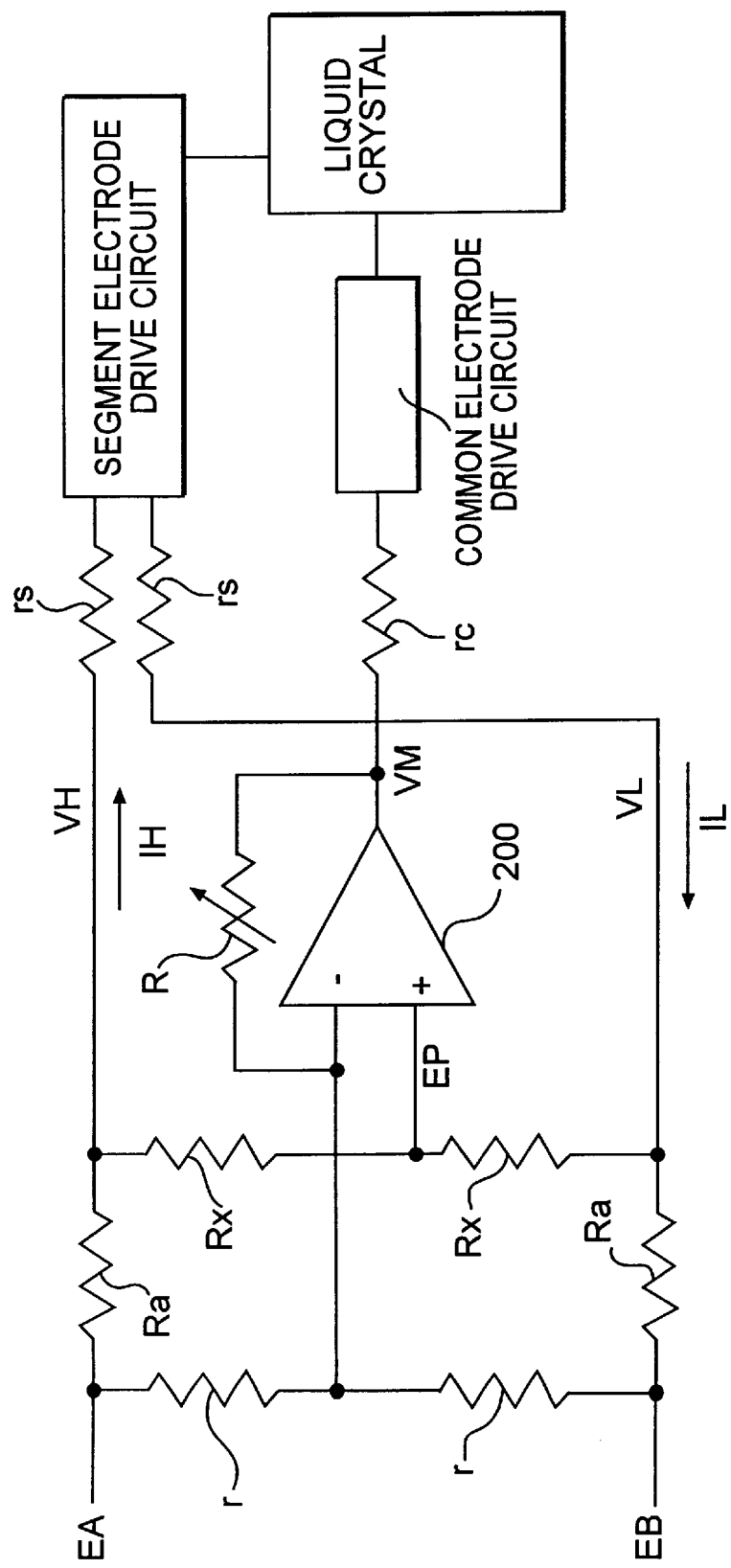
FIG. 2 is a diagram of a power source circuit for improving the quality of a display.
Figure 4A:
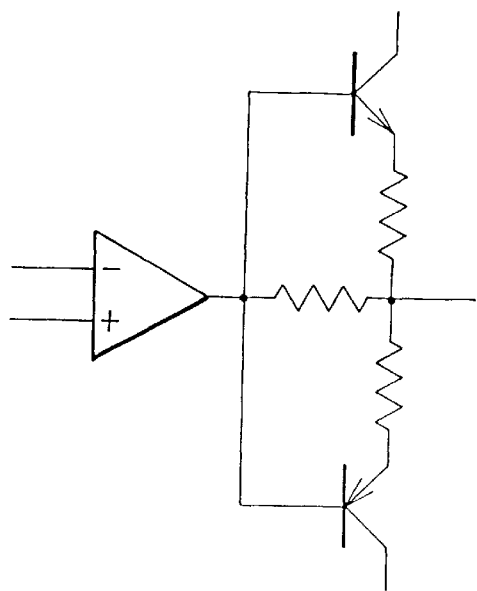
FIGS. 4(a) and 4(b) are circuit diagrams showing conventional boosters of the emitter output type.
Figure 4B:
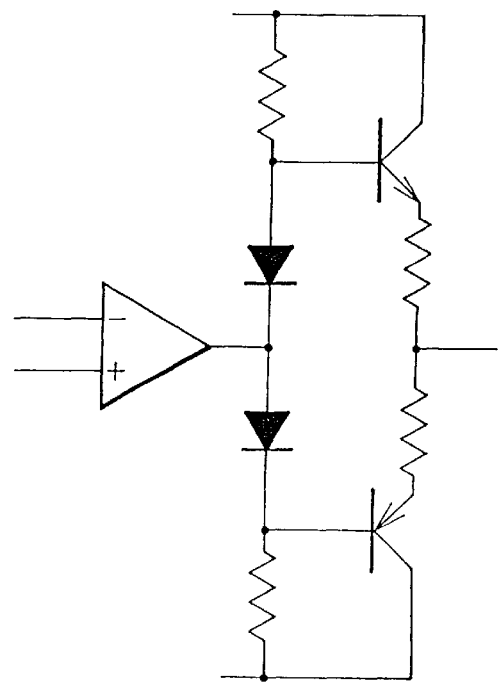
Figure 5:
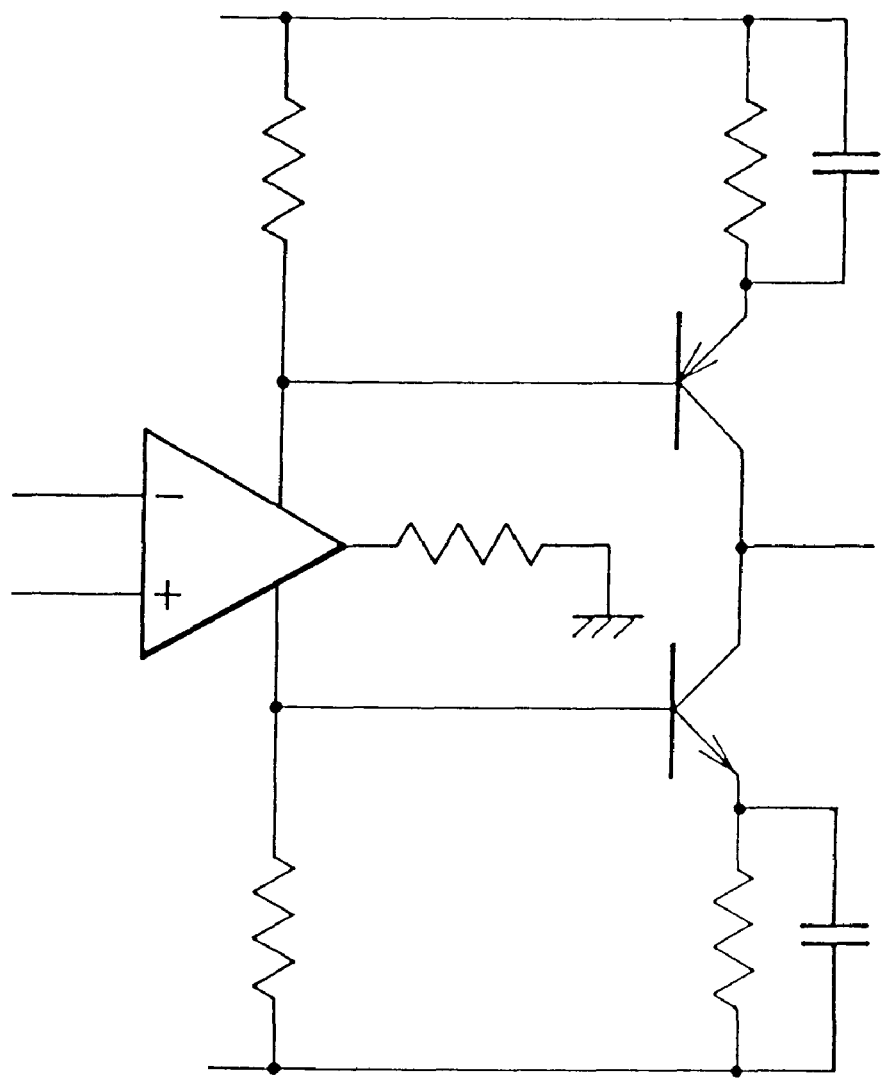
FIG. 5 is a circuit diagram showing a conventional booster of the collector output type.
Figure 14:
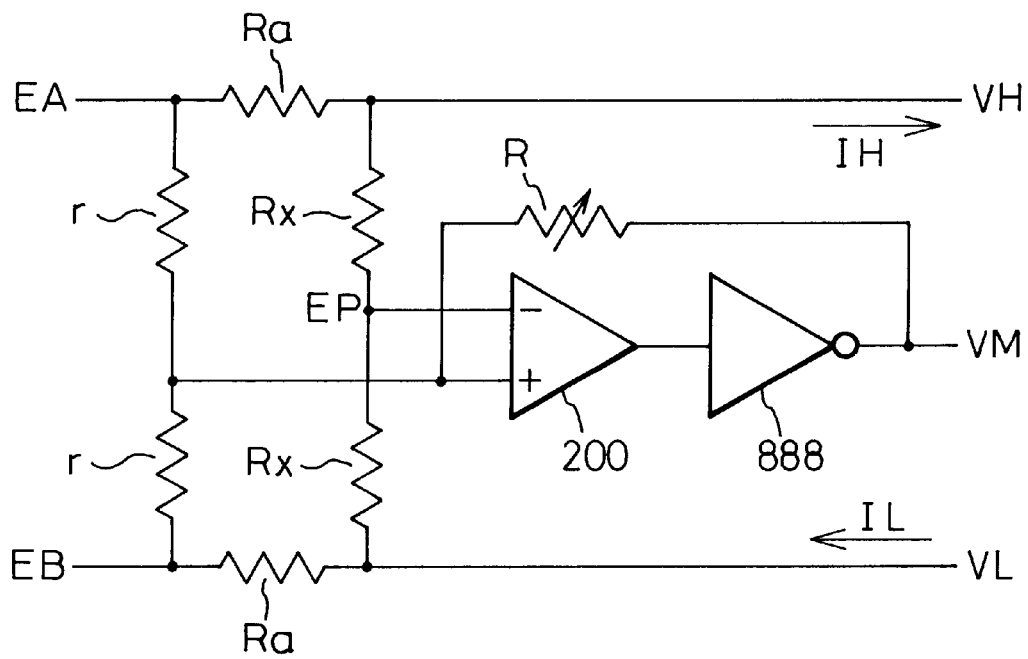
FIG. 14 is a diagram of a constitution in which a circuit for driving a capacitive load according to the present invention is adapted to the institution of FIG. 2.

FIG. 14 illustrates an example in which the booster of the present invention is adapted to the constitution of FIG. 2, and wherein the output terminal OUT of the differential amplifier 200 is connected to an input terminal IN of a booster 888 of the present invention, and an output terminal OUT of the booster 888 is connected to a positive input terminal of the differential amplifier 200. Because of the inverted amplification of the booster 888, the positive and negative input terminals of the differential amplifier 200 are all connected contrary to the case of FIG. 2. The operation of this constitution will be described with reference to the case where the ninth embodiment shown in FIG. 1 is adapted to the above booster 888. When the currents IH and IL are not flowing, the output voltage VM is fixed to (EA+EB)/2. No output current is required under this condition. By suitably selecting the values of the resistors 102, 105, 106, 109, 112 and 113, therefore, the current consumed by the booster 888 can be set to a very small value. Next, when the current IH flows, the voltage at the input terminal of the booster 888 rises, i.e., this change is transmitted to the base terminal of the PNP transistor 104 which is the first transistor and to the base terminal of the NPN transistor 111 which is the second transistor via the capacitors 103 and 110. As a result, the base potential of the PNP transistor 104 which is the first transistor rises to drive the PNP transistor 104 which is the first transistor itself in the turn-off direction, and the base potential of the NPN transistor 111 which is the second transistor rises to drive the NPN transistor 111 which is the second transistor itself in the turn-on direction. At this moment, the base current flows into the second NPN transistor 111 via the capacitor 110, making it possible to obtain a sufficiently large value even for a very small change in the input. In this case, an instantaneous and large current that flows into the emitter of the NPN transistor 111 flows mostly into the capacitor 114, and a very small current only flows into the power source line L1.

When the current IH no longer flows and the output of the differential amplifier 200 returns to a statically stabilized condition, the output potential of the booster 100 becomes (EA+EB)/2 again, and the electric charge stored in the capacitor 114 gradually discharges into the power source line L1 via the resistor 113 and returns to the initial state. When the current IL flows, an operation similar to the above-mentioned one is carried out with the PNP transistor as a center. This operation can be easily understood and is therefore not described here. In this case, however, the NPN transistor which is the second transistor is driven in the turn-off direction. Therefore, the current flowing into the resistor 113 consists of the discharge current only of the capacitor 114, i.e., the discharge is accelerated.

The booster according to the present invention exhibits a sufficiently large voltage amplification factor and a sufficiently large current amplification factor for the dynamic signals. Therefore, the operation of the differential amplifier 200 can be confined within a small amplification range. The differential amplifier 200 needs to bear only a very small load and does not lose high-speed performance. This, in other words, means that the differential amplifier 200, despite its very simply construction, can be sufficiently put into practical use by being combined with the booster of the present invention.

That is, the differential amplifier circuit according to the present invention is suited for being used as a circuit for driving a capacitive load.

Figure 15:
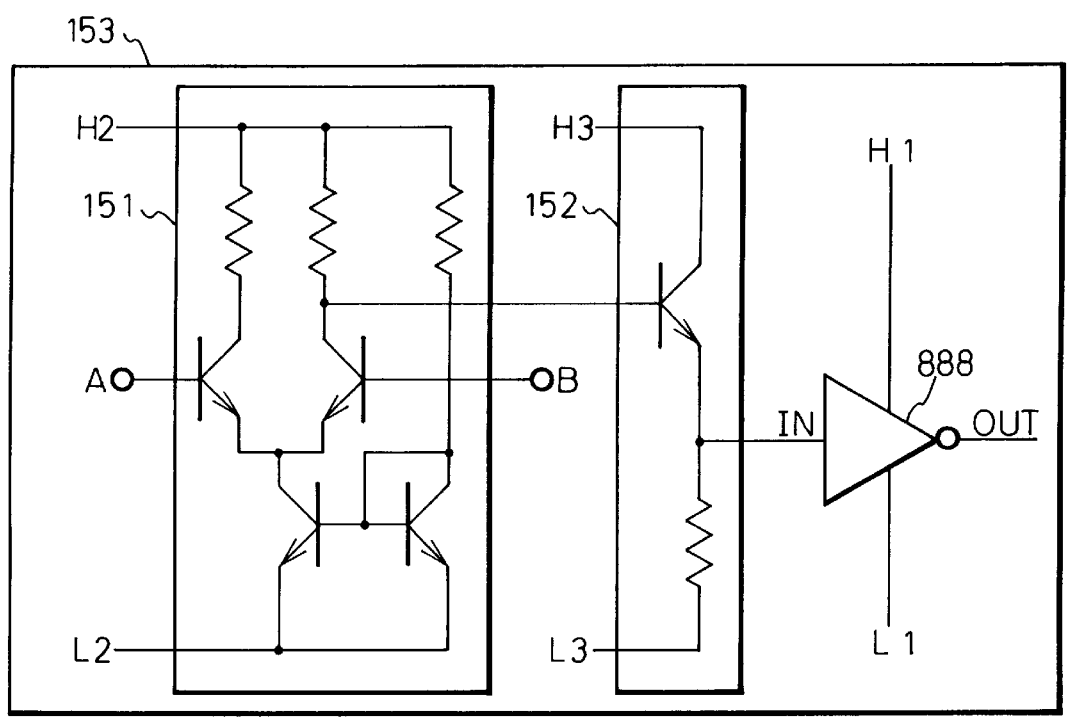
FIG. 15 is a diagram of a constitution illustrating a ninth embodiment of the present invention.

FIG. 15 illustrates a different embodiment of the present invention constituted based on the above-mentioned idea, and in which an output terminal of a most simply constituted differential amplifier 151 connected to fifth and sixth power source lines H2 and L2, is connected to an input terminal of a buffer 152 that is connected to seventh and eighth power source lines H3 and L3, and an output terminal of the buffer 152 is connected to the input terminal IN of the booster circuit 888. The potentials of the power source lines H1, H2, H3, L1, L2 and L3 may be equal to or different from each other. In this embodiment, H3=5V, L3=-5V, H1 and H2=20V, L1 and L2=-20V, and ±20V is gained from a voltage source that rises starting from 5V, to obtain very satisfactory results.

FIG. 15 shows a connection between the differential amplifier 151, the buffer 152 and the booster 888. The circuit of FIG. 15 as a whole can be regarded as a novel differential amplifier 153. From the standpoint of precise characteristics, this novel differential amplifier 153 may be inferior to so-called operational amplifiers that have been placed on the market. The differential amplifier 153, however, sufficiently satisfies the aforementioned conditions (A) to (G) required for the differential amplifier contemplated by the present invention and is simple in constitution and can, therefore, be fabricated at a much lower cost than the high-speed differential amplifiers that are now on the market. Moreover, the circuit excluding the large capacity capacitors can be easily fabricated in an integrated form.

Figure 17:
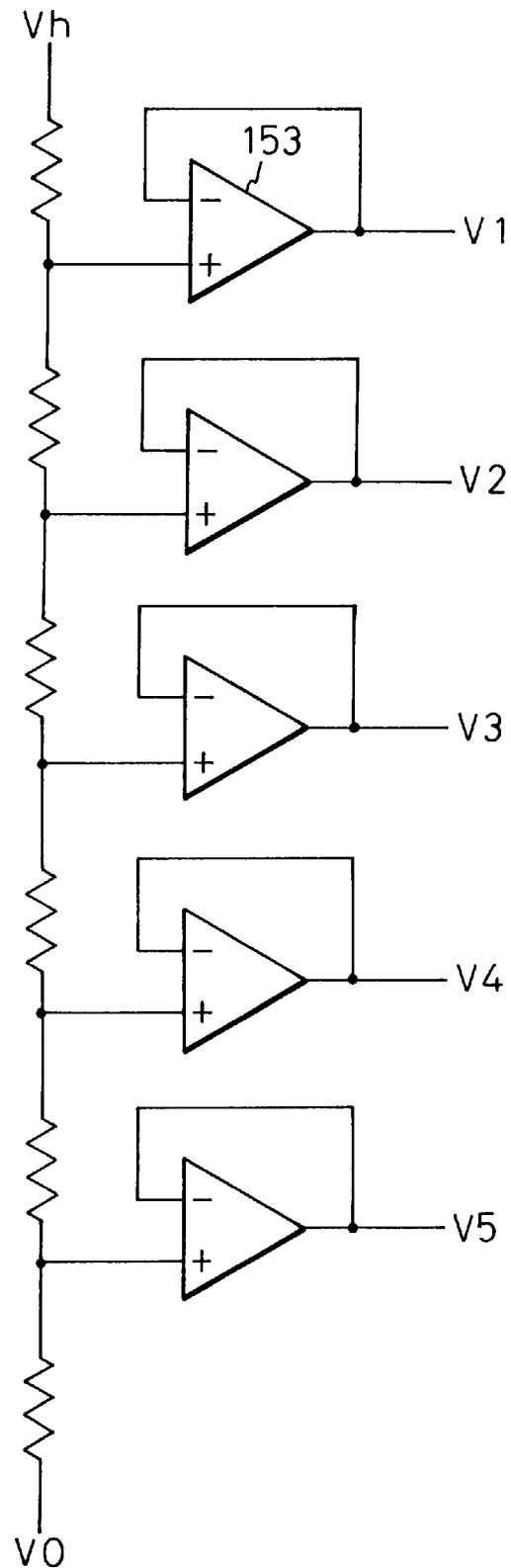
FIG. 17 illustrates an example of using a circuit for driving a capacitive load as a power source for driving liquid crystals.

The differential amplifier 153 according to the present invention shown in FIG. 15 exhibits excellent effects when it is adapted to a conventional differential amplifier as a buffer for a power source for driving a liquid crystal display device as shown in FIG. 17.

According to this circuit, potentials of from V1 to V5 obtained through a resistance ladder circuit connected between the potentials Vh and V0 are power-amplified by using novel differential amplifiers 153 of the present invention. With this circuit, the output potential changes very little despite the flow of a large spike-like current when driving the liquid crystals, and the consumption of electric power is small.

Figure 16:
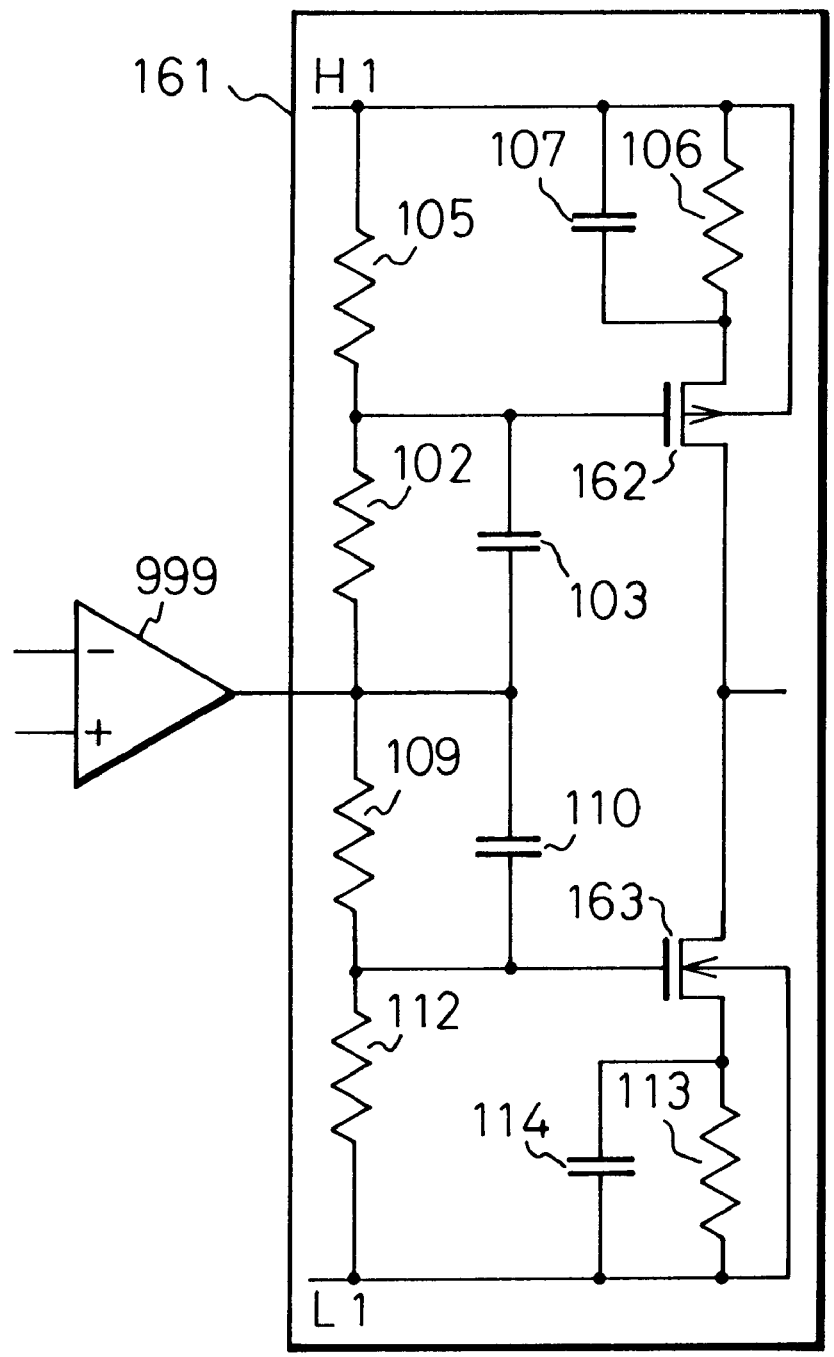
FIG. 16 is a circuit diagram illustrating a tenth embodiment in which the circuit for driving a capacitive load of the present invention is constituted by field-effect transistors.

In the foregoing description, the transistors that are used are all bipolar transistors. It is, however, also allowable that some or all of the transistors may be field-effect transistors. FIG. 16 illustrates an embodiment in which the differential amplifier circuit according to the present invention is constituted using field-effect transistors.

In FIG. 16, the output terminal of the differential amplifier 999 is connected to the input terminal of the booster 161, and this input terminal is connected to the gate terminal of a P-channel field-effect transistor 162 via a parallel circuit consisting of a resistor 102 and a capacitor 103, and is further connected to an end of a resistor 105.

The source terminal of the P-channel field-effect transistor 162 is connected to the power source line H1 via a parallel circuit consisting of a resistor 106 and a capacitor 107, and the other end of the resistor 105 is connected to the power source line H1.

The substrate terminal of the P-channel field-effect transistor 162 is connected either to the source terminal or directly to the power source line H1.

The input terminal is further connected to the gate terminal of an N-channel field-effect transistor 163 via a parallel circuit consisting of a resistor 109 and a capacitor 110, and is connected to an end of a resistor 112. The source terminal of the N-channel field-effect transistor 163 is connected to the power source line L1 via a parallel circuit consisting of a resistor 113 and a capacitor 114, and the other end of the resistor 112 is connected to the power source line L1.

As a result, there is no need of decreasing the discharge time constant by using the diode, i.e., the diode can be omitted.

Figure 18:
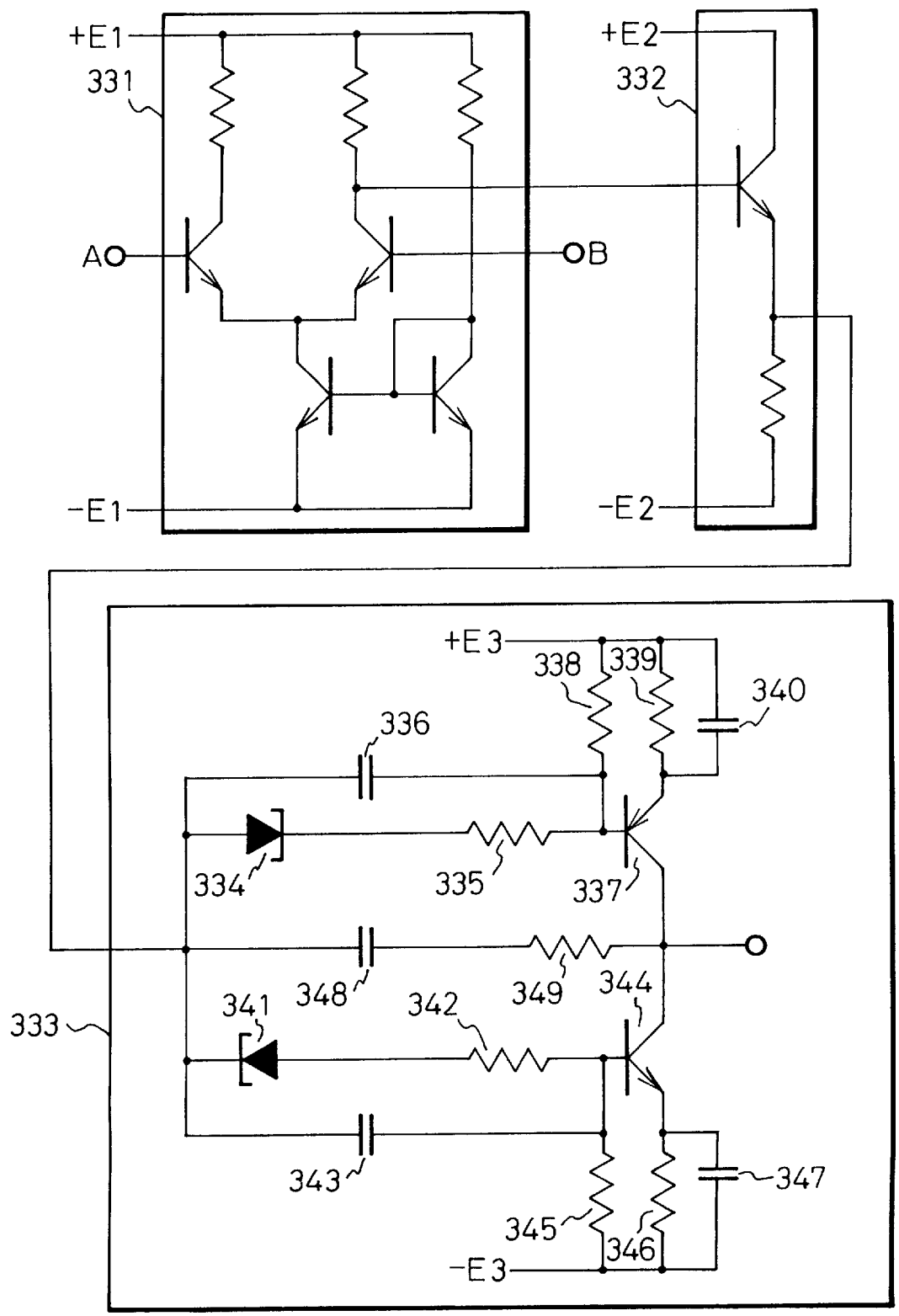
FIG. 18 is a diagram which explains an eleventh embodiment of the present invention.

FIG. 18 illustrates an eleventh embodiment of the present invention that is related to improving the differential amplifier which is used in the present invention. As mentioned earlier, high-speed operation, large amplitude and relatively large current output are required for the differential amplifier that is used for the present invention. This performance, however, is required for only a short period of time in which a spike-like current flows into the capacitive load, and most of the time, such output current is not required. Therefore, the differential amplifier is constituted differently from ordinary amplifiers.

In FIG. 18, a first-stage differential amplifier 331 supplied by power sources +E1 and -E1 has two input terminals A and B, and its output is applied to a buffer 332 that is supplied by power sources +E2 and -E2. The output of the buffer 332 is applied to a novel final-stage amplifier 333 which is constituted as described below. The input terminal of the final-stage amplifier 333 is connected to the base terminal of a PNP transistor 337 via a parallel circuit consisting of a capacitor 336 and a series circuit consisting of a Zener diode 334 and a resistor 335, and the base terminal of the PNP transistor 337 is connected to the power source +E3 via a resistor 338. The emitter terminal of the PNP transistor 337 is connected to the power source +E3 via a parallel circuit consisting of a resistor 339 and a capacitor 340. The input terminal of the final-stage amplifier 333 is further connected to the base terminal of an NPN transistor 344 via a parallel circuit consisting of a capacitor 343 and a series circuit of a Zener diode 341 and a resistor 342, and the base terminal of the NPN transistor 344 is connected to the power source -E3 via a resistor 345. The emitter terminal of the NPN transistor 344 is connected to the power source -E3 via a parallel circuit consisting of a resistor 346 and a capacitor 347. The collector of the PNP transistor 337 and the collector of the NPN transistor 344 are connected together to form a final output terminal which is connected to the input terminal of the final-stage amplifier 333 via a resistor 349 and a capacitor 348.

The first-stage differential amplifier 331 and the buffer 332 are constituted in a customary manner and have connected thereto the differential amplifier of the present invention. As described above, the circuit of the differential amplifier of the present invention is symmetrically constituted in the up and down direction. Therefore, only the upper half will be described below. The Zener diode 334, the resistor 335 and the resistor 338 determine a static potential at the base terminal of the PNP transistor 337 which is the first transistor. The resistor 339 inserted in the emitter terminal of the PNP transistor 337 has a negative feedback function. By suitably selecting the static potential at the base terminal and the value of the resistor 339, therefore, a static current that flows into the collector of the PNP transistor 337 can be set to a very small value.

If the input to the final-stage amplifier 333 drops, this change in the voltage is transmitted to the base terminal of the PNP transistor 337 via the capacitor 336. Since the emitter terminal of the PNP transistor 337 is connected to +E3 through the capacitor 340, the negative feedback function of the resistor 339 does not act in response to a quick change in the base potential, and a large current flows into the collector through the capacitor 340 in response to a change in the base potential. When a change in the base potential takes place within a short period of time, the potential changes little at the emitter terminal of the PNP transistor 337 and when the potential at the base terminal changes intermittently, the capacitor 340 is charged again via the resistor 339 until the base potential changes a next time, and the initial static condition is restored. When the input to the final-stage amplifier 333 rises, the PNP transistor 337 is shut off, and the current flowing through the resistor 339 is all used for charging the capacitor 340 again.

The capacitor 348 and the resistor 349 form a negative feedback circuit for preventing self oscillation, which can be omitted depending upon the case. The capacitors 340 and 347 may be grounded instead of being connected to +E3 and −E3. The Zener diode 334 and 341 may be omitted. Depending upon the case, the capacitors 336 and 343 may also be omitted. The power sources |E1|, |E2|, and |E3| may have the same voltage or different voltages. In the embodiments, |E2| was 5V, and |E1| and |E3| were both 20V boosted from 5V, and quite satisfactory results were obtained in regard to both consumption of electric power and operational speed. In FIG. 18, bipolar transistors were used as active elements. However, some or all of the active elements may be constituted by field-effect transistors. When the final-stage transistors 337 and 344 in the final-stage amplifier 333 are constituted by field-effect transistors, use is made of complementary field-effect transistors having a resistance element inserted in the sources thereof. Moreover, the initial-stage differential amplifier 331, or the initial-stage differential amplifier 331 and the buffer 332, may be made up of an ordinary high-speed amplifier. In this case, the final-stage amplifier 333 serves as a high-speed booster.

As described above, the differential amplifier circuit according to the present invention exhibits very excellent performance at a low cost when it is used as the differential amplifier circuit in the aforementioned Japanese Patent Application No. 2-184147 which is intended to improve contrast and response characteristics while removing crosstalk and, hence, makes it possible to provide a high quality display device. The differential amplifier circuit of the present invention can be used for devices other than a display device, as a matter of course. Accordingly, the use of the present invention is in no way limited only to the differential amplifier that is disclosed in Japanese Patent Application No. 2-184147.

According to the present invention, both the constitution of the booster and the differential amplifier circuit which uses the booster are defined as a circuit for driving a capacitive load.

What is claimed is:

1. A capacitive load driving circuit for amplifying spike-superposed signals in which small spike signals having positive and negative directions are superposed upon a defined input voltage, comprising:

one common input terminal to which the spike-superposed signals a common output terminal which is used as the output of the capacitive load driving circuit;

a first power source line connected to a first DC power source;

a second power source line connected to a second DC power source;

a first transistor having an emitter, a base, and a collector;

the emitter of the first transistor being connected to the first power source line;

a first DC path for a first DC current from the first power source line to the common input terminal via the base of the first transistor; and a first capacitor connected between the base of the first transistor and the common input terminal in order to transfer the small spike signals;

wherein the collector of the first transistor which provides an output of the first transistor is connected to the common output terminal, and the first transistor amplifies with non-infinite gain one of the positive and negative small spike signals and the defined voltage;

a second transistor having an emitter, a base, and a collector;

the emitter of the second transistor being connected to the second power source line;

a second DC path for a second DC current from the second power source line to the common input terminal via the base of the second transistor; and a second capacitor connected between the base of the second transistor and the common input terminal in order to transfer the small spike signals;

wherein the collector of the second transistor which provides an output of the second transistor is connected to the common output terminal, and the second transistor amplifies with non-infinite gain the other of the positive and negative small spike signals and the defined voltage;

the capacitive load driving circuit being free of a feedback circuit connected between the common output terminal and the common input terminal whereby the spike-superposed signals are amplified without feedback from the common output terminal to the common input terminal via the feedback circuit.

2. A capacitive load driving circuit for amplifying spike-superposed signals in which small spike signals having positive and negative directions are superposed upon a defined input voltage, comprising:

one common input terminal to which the spike-superposed signals are input;

a common output terminal which is used as the output of the capacitive load driving circuit;

a first power source line connected to a first DC power source;

a second power source line connected to a second DC power source;

a first transistor having a source, a gate, and a drain;

the source of the first transistor being connected to the first power source line;

a first DC path from the common input terminal to the gate of the first transistor; and at least a first capacitor connected between the gate of the first transistor and the common input terminal in order to transfer the small spike signals;

wherein the drain of the first transistor which provides an output of the first transistor is connected to the common output terminal, and the first transistor amplifies with non-infinite gain one of the positive and negative small spike signals and the defined voltage;

a second transistor having a source, a gate, and a drain;

the source of the second transistor being connected to the second power source line;

a second DC path from the common input terminal to the gate of the second transistor; and at least a second capacitor connected between the gate of the second transistor and the common input terminal in order to transfer the small spike signals;

wherein the drain of the second transistor which provides an output of the second transistor is connected to the common output terminal, and the second transistor amplifies with non-infinite gain the other of the positive and negative small spike signals and the defined voltage;

the capacitive load driving circuit being free of a feedback circuit connected between the common output terminal and the common input terminal whereby the spike-superposed signals are amplified without feedback from the common output terminal to the common input terminal via the feedback circuit.

3. A circuit for driving a capacitive load provided by a liquid crystal device by amplifying spike-superposed signals in which small spike signals having positive and negative directions are superposed upon a defined voltage, comprising:

one common input terminal to which the spike-superposed signals are input;

a common output terminal which is used as the output of the capacitive load driving circuit;

a first power source line connected to a first DC power source;

a second power source line connected to a second DC power source;

a first transistor having an emitter, a base, and a collector;

the emitter of the first transistor being connected to the first power source line;

a first DC path for a first DC current from the first power source line to the common input terminal via the base of the first transistor; and a first capacitor connected between the base of the first transistor and the common input terminal in order to transfer the small spike signals;

wherein the collector of the first transistor which provides an output of the first transistor is connected to the common output terminal, and the first transistor amplifies with non-infinite gain one of the positive and negative small spike signals and the defined voltage;

a second transistor having an emitter, a base, and a collector;

the emitter of the second transistor being connected to the second power source line;

a second DC path for a second DC current from the second power source line to the common input terminal via the base of the second transistor; and a second capacitor connected between the base of the second transistor and the common input terminal in order to transfer the small spike signals;

wherein the collector of the second transistor which provides an output of the second transistor is connected to the common output terminal, and the second transistor amplifies with non-infinite gain the other of the positive and negative small spike signals and the defined voltage;

the capacitive load driving circuit being free of a feedback circuit connected between the common output terminal and the common input terminal whereby the spike-superposed signals are amplified without feedback from the common output terminal to the common input terminal via the feedback circuit.

4. A circuit for driving a capacitive load provided by a liquid crystal device by amplifying spike-superposed signals in which small spike signals having positive and negative directions are superposed upon a defined voltage, comprising:

one common input terminal to which the spike-superposed signals are input;

a common output terminal which is used as the output of the capacitive load driving circuit;

a first power source line connected to a first DC power source;

a second power source line connected to a second DC power source;

a first transistor having a source, a gate, and a drain;

the source of the first transistor being connected to the first power source line;

a first DC path from the common input terminal to the gate of the first transistor; and at least a first capacitor connected between the gate of the first transistor and the common input terminal in order to transfer the small spike signals;

wherein the drain of the first transistor which provides an output of the first transistor is connected to the common output terminal, and the first transistor amplifies with non-infinite gain one of the positive and negative small spike signals and the defined voltage;

a second transistor having a source, a gate, and a drain;

the source of the second transistor being connected to the second power source line;

a second DC path from the common input terminal to the gate of the second transistor; and at least a second capacitor connected between the gate of the second transistor and the common input terminal in order to transfer the small spike signals;

wherein the drain of the second transistor which provides an output of the second transistor is connected to the common output terminal, and the second transistor amplifies with non-infinite gain the other of the positive and negative small spike signals and the defined voltage;

the capacitive load driving circuit being free of a feedback circuit connected between the common output terminal and the common input terminal whereby the spike-superposed signals are amplified without feedback from the common output terminal to the common input terminal via the feedback circuit.

* * * * *